(12) United States Patent
Bednar et al.

(10) Patent No.: US 6,470,476 B2
(45) Date of Patent: Oct. 22, 2002

(54) SUBSTITUTION OF NON-MINIMUM GROUNDRULE CELLS FOR NON-CRITICAL MINIMUM GROUNDRULE CELLS TO INCREASE YIELD

(75) Inventors: Thomas R. Bednar, Essex Junction, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 09/810,763

(22) Filed: Mar. 16, 2001

(65) Prior Publication Data

US 2002/0133787 A1 Sep. 19, 2002

(51) Int. Cl.[7] .............................. G06F 17/50; G06F 9/45
(52) U.S. Cl. ............................................. 716/2; 716/10
(58) Field of Search .............................. 716/2, 8, 9, 10, 716/12, 14

(56) References Cited

U.S. PATENT DOCUMENTS

| | | | |
|---|---|---|---|
| 5,218,551 A | 6/1993 | Agrawal et al. | 716/10 |
| 5,237,514 A | 8/1993 | Curtin | 716/10 |
| 5,422,317 A | 6/1995 | Hua et al. | 716/1 |
| 5,544,071 A | 8/1996 | Keren et al. | 716/6 |
| 5,666,290 A | 9/1997 | Li et al. | 716/8 |
| 5,724,250 A * | 3/1998 | Kerzman et al. | 364/488 |
| 5,731,985 A | 3/1998 | Gupta et al. | 716/8 |
| 5,910,897 A | 6/1999 | Dangelo et al. | 716/4 |
| 5,910,899 A | 6/1999 | Barrientos | 716/8 |
| 5,926,396 A | 7/1999 | Ohara | 716/4 |
| 5,932,900 A | 8/1999 | Lin et al. | 257/204 |
| 5,956,497 A | 9/1999 | Ratzel et al. | 716/1 |
| 6,026,220 A | 2/2000 | Cleereman et al. | 703/23 |
| 6,145,117 A | 11/2000 | Eng | 716/18 |
| 6,202,193 B1 * | 3/2001 | Emura et al. | 716/10 |
| 6,233,722 B1 * | 5/2001 | LaBerge | 716/10 |
| 6,272,668 B1 * | 8/2001 | Teene | 716/10 |
| 6,275,973 B1 * | 8/2001 | Wein | 716/10 |
| 6,336,207 B2 * | 1/2002 | Shinomiya et al. | 716/11 |

OTHER PUBLICATIONS

IBM Technical Disclosure Bulletin, "Time–Driven CMOS Gate Placement", vol. 33, No. 1A, Jun. 1990, pp. 441–442.

* cited by examiner

*Primary Examiner*—Don Wong
*Assistant Examiner*—Minh D A
(74) *Attorney, Agent, or Firm*—McGinn & Gibb, PLLC; Richard M. Kotulak, Esq.

(57) ABSTRACT

A structure and method for improving yield during physical chip design comprises identifying non-critically timed minimum groundrule cells located within the chip design, determining if whitespace exists around the non-critically timed minimum groundrule cells, and replacing the non-critically timed minimum groundrule cells that have the whitespace with non-minimum groundrule cells if the replacing leaves a functionality of the circuit unaltered.

24 Claims, 4 Drawing Sheets

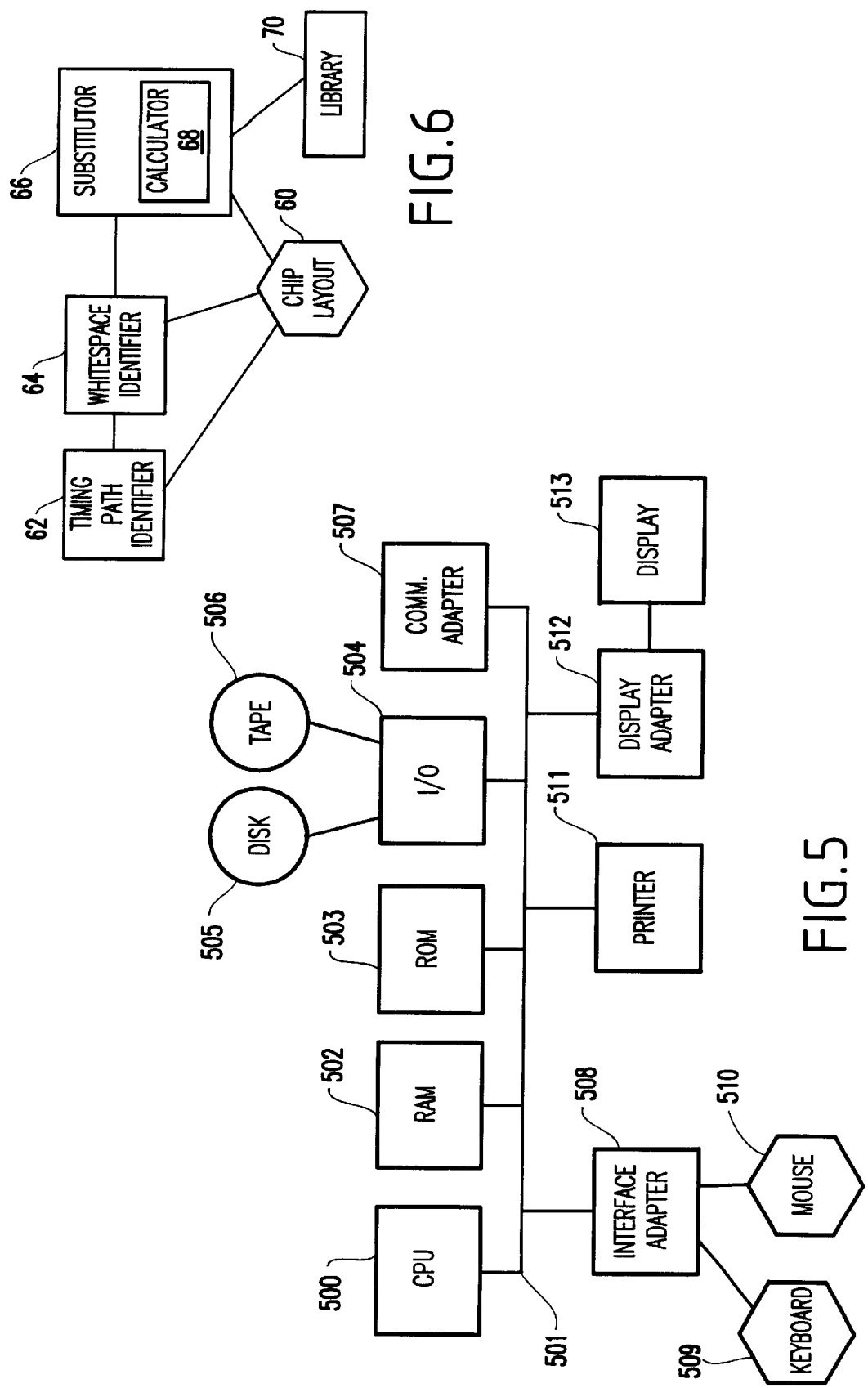

SUBSTITUTION OF NON-MINIMUM GROUNDRULE CELLS FOR NON-CRITICAL MINIMUM GROUNDRULE CELLS TO INCREASE YIELD

BACKGROUND OF THE INVENTION

1. Field of the Invention

The present invention generally relates to integrated circuit chip design and more particularly to an improved process for placing items within a chip design that utilizes unused white space to increase yield.

2. Description of the Related Art

Conventional chip design procedures follow a flow similar to that shown in FIG. 1. First, chip physical design is initiated 10. This includes reading chip netlist and technology data. Next, the chip is floorplanned 11 and detailed placement of logic is finalized 12. Next, power routing is finalized 13. Then signals are routed 14 and finally the design is verified 15. The foregoing processes are well-known to those ordinarily skilled in this art field and are not discussed in detail so as not to obscure the salient features of the invention.

Each logic cell placed during the creation of the floorplan 11 is typically designed to minimum design groundrules in order to optimize total chip area during placement of logic devices. However, using very small minimum groundrule cells may negatively impact yield because smaller devices and wires are more likely to be affected by smaller particles of foreign matter. A typical manufacturing environment contains more smaller foreign matter particles than larger particles, which allows larger wires and larger devices (which are not adversely affected by the smaller particles) to have a higher yield (and higher reliability). Further, during the placement of logic devices, there often exists whitespace (areas of the design that do not have any cells) that is not used. Therefore, there is a need for a design process that utilizes such whitespace in an efficient and automated manner to increase yield.

SUMMARY OF THE INVENTION

It is, therefore, an object of the present invention to provide a structure and method for improving yield during physical chip design that comprises identifying non-critically timed minimum groundrule cells located within the chip design, determining if whitespace exists around the non-critically timed minimum groundrule cells, and replacing the non-critically timed minimum groundrule cells that have the whitespace with non-minimum groundrule cells if the replacing leaves the functionality of the circuit unaltered. Thus, while the invention may alter the timing somewhat, it does not alter the timing enough to alter the functionality of the circuit.

The invention calculates incremental timing effects caused by replacing each of the non-critically timed minimum groundrule cells with non-minimum groundrule cells, and incrementally returns selected ones of the non-critically timed minimum groundrule cells in place of the non-minimum groundrule cells in the chip design if the incremental timing effects indicate that the replacing produces unacceptable circuit timing changes. The invention only replaces the non-critically timed minimum groundrule cells with the non-minimum groundrule cells if enough space is available to accommodate the non-minimum groundrule cells. A determination of whether enough whitespace is available is made based upon a comparison of the whitespace to a library of the non-minimum groundrule cells containing cell size information.

The timing of the circuit is considered "unaltered" if the circuit has a similar timing performance with the non-critically timed minimum groundrule cells and the non-minimum groundrule cells. In addition, the non-critically timed minimum groundrule cells are physically smaller and have a lower manufacturing yield than the non-minimum groundrule cells. The invention increases chip yield by decreasing the number of lower-yielding cells (minimum groundrule cells) and increasing the number of higher-yielding cells (non-minimum groundrule cells).

BRIEF DESCRIPTION OF THE DRAWINGS

The foregoing and other objects, aspects and advantages will be better understood from the following detailed description of preferred embodiments of the invention with reference to the drawings, in which:

FIG. 5 is a schematic diagram of a hardware embodiment of the invention; and

FIG. 6 is a schematic diagram of a system embodiment of the invention.

DETAILED DESCRIPTION OF PREFERRED EMBODIMENTS OF THE INVENTION

As discussed above, conventional cell design complies with minimum design rules in order to minimize chip size during layout. During layout, there is often available whitespace that is not used. The invention uses this whitespace to increase yield by substituting non-critically designed cells for critically designed cells that do not lie in a timing critical path.

The invention substitutes non-critically designed cells for minimum groundrule cells when whitespace is available during cell placement in order to increase yield. In other words, the minimum groundrule cells are typically manufactured using cutting edge technology. While such cutting edge technology can produce extremely small cells, it does not produce the cells as reliably and with as low a number of defects when compared to non-minimum groundrule cells. The larger, non-minimum groundrule cells have a lower chance of being defective because larger structures and wires are not as sensitive to smaller particles of foreign matter. To the contrary, the smaller wires and devices in the minimum groundrule cells are more sensitive to the smaller particles. Obviously, both the larger and smaller wires will be adversely affected by larger particles. Since there are more smaller particles than larger particles on average, there will be more defects in the smaller minimum groundrule cells. By substituting non-minimum groundrule cells wherever there is available whitespace and where the timing of the circuit will not be affected, the invention increases yield (and thus reliability) by utilizing more of the higher-yield non-minimum groundrule cells and less of the lower-yield minimum groundrule cells.

In its most basic form, the invention could manually substitute non-minimum groundrule cells for appropriate critically designed cells, but for designs with over a million cells, such processing is very time consuming and unrealistic. Therefore, in a preferred embodiment, the invention automatically substitutes cells that are not designed to minimum groundrule for those that are in areas of the chip where excess whitespace will allow for larger cells without impacting overall chip size or performance.

Figure 2:
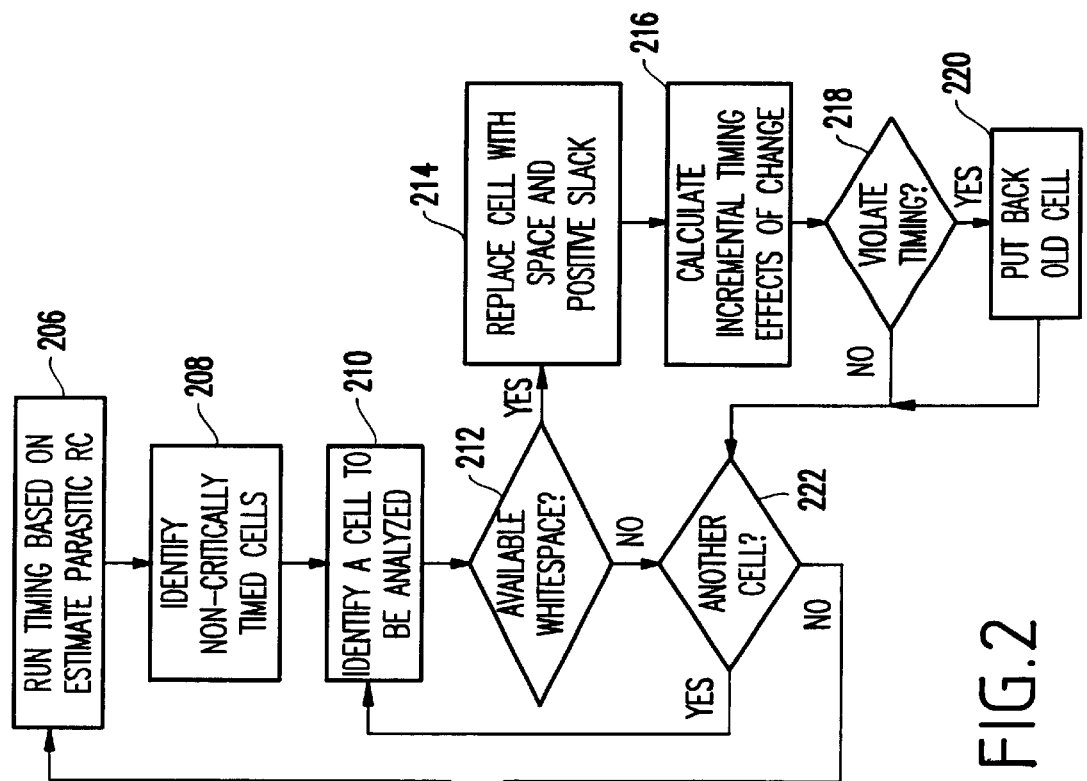
FIG. 2 is a flow diagram illustrating a preferred chip design process according to the invention.
Figure 1:
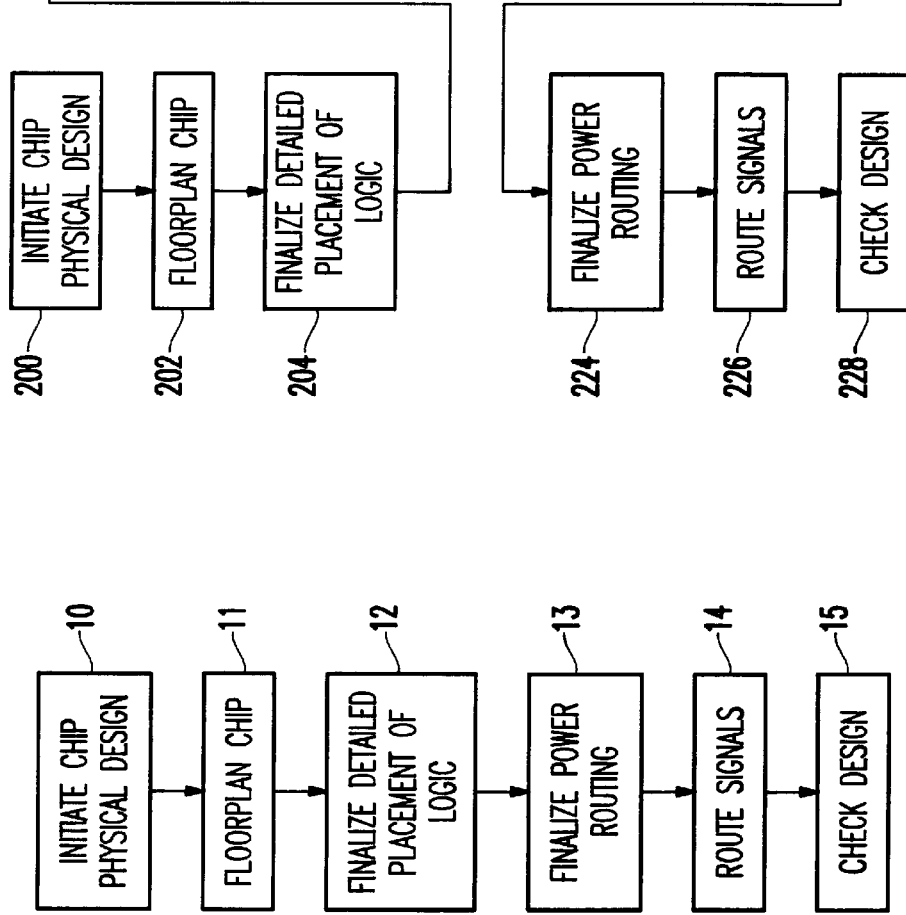
FIG. 1 is a flow diagram illustrating a chip design process.

FIG. 2 illustrates the invention in flowchart form. Items 200, 202, 204, 224, 226, 228 are substantially similar to items 10–15 shown in FIG. 1. However, the invention includes additional processing between items 204 and 224 that is not performed conventionally. Therefore, the invention begins with the initial chip physical design, as shown in item 200. Then, the invention prepares a floorplan for the chip in item 202 and finalizes the detailed placement of logic cells in item 204.

After the detailed placement of logic is finalized 204, a timing analysis (e.g., Einstimer timing analysis, available from IBM Corporation, Armonk, N.Y., USA) is run on the design based on estimated parasitic resistance and capacitance 206. Since routing has not been done yet, this estimate will be used to model wiring resistance and capacitance as well as circuit loads. When timing runs are clean, non-timing critical cells are identified 208 (i.e. using any well-known identifier, such as Einstimer slack report, available from IBM Corporation, Armonk, N.Y., USA). A cell is identified 210 from this list of non-timing critical cells and the invention determines if whitespace is available around the identified non-timing critical cell 212 using any design program, such as Chipbench, available from IBM Corporation, Armonk, N.Y., USA.

Figure 3:
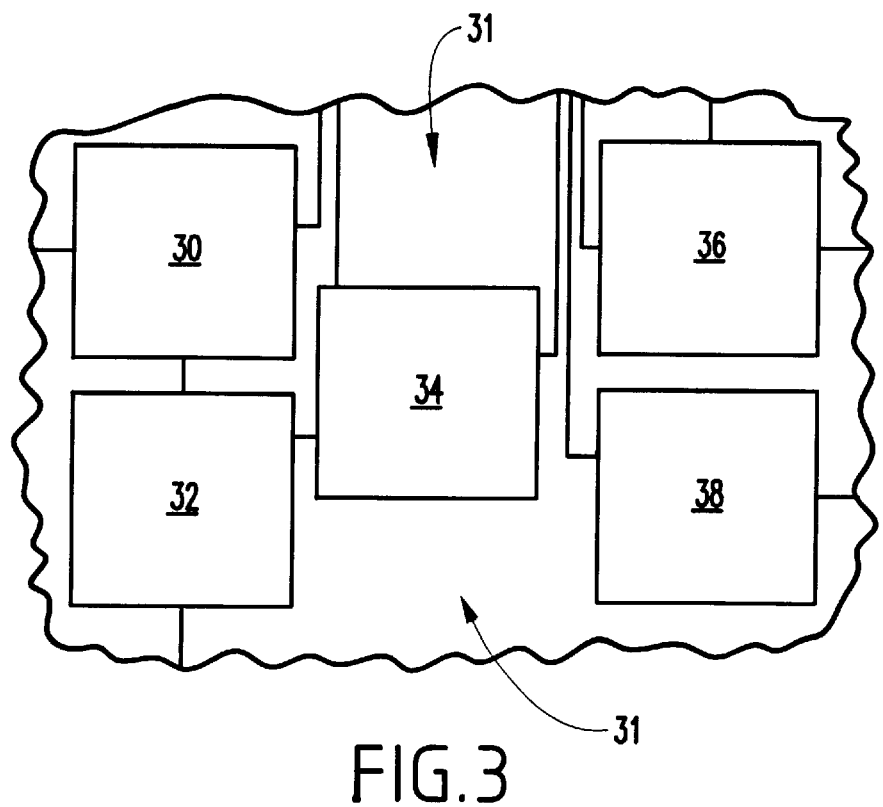
FIG. 3 is a schematic diagram of a portion of a chip design.
Figure 4A:
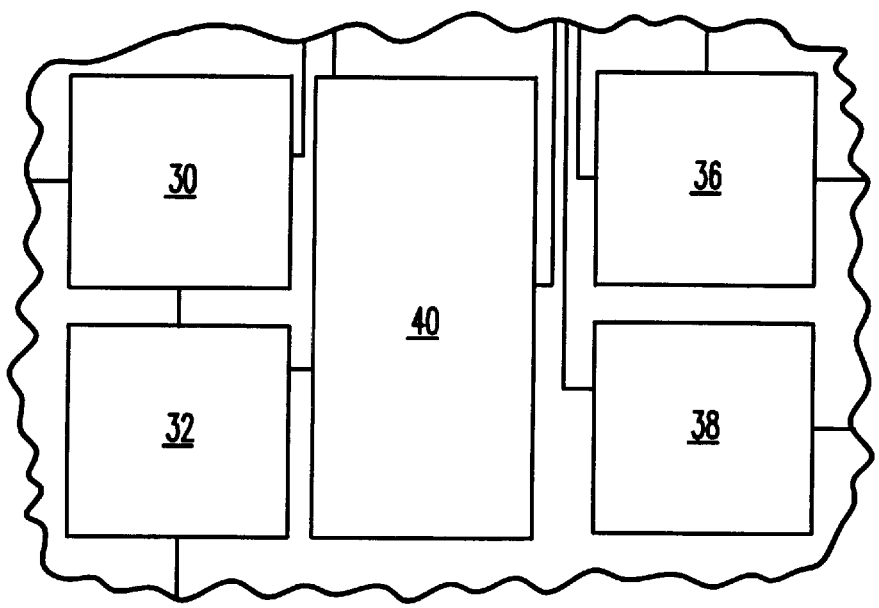
FIG. 4A is a schematic diagram of a portion of a chip design.

As shown in item 214, if enough whitespace is available, that cell is replaced with a larger non-critical cell. FIGS. 3 and 4 illustrate this process schematically. More specifically, FIGS. 3 and 4 illustrate a very small portion of a chip floorplan. In FIG. 3 items 30, 32, 34, 36, and 38 represent minimum groundrule cells (e.g., cells that are small enough that they do not exceed the minimum size specified by the design groundrule for the chip design). The cells have various wires connecting them to other devices within the circuit. Whitespace 31 exists above and below cell 34. As discussed above, if cell 34 is determined (in item 208) to be a non-critically timed cell, the invention identifies the white space 31 (in item 221) and replaces the minimum groundrule cell 34 with a non-minimum groundrule cell 40, as shown in FIG. 4 (and as discussed in item 214 above). As shown in the drawings, the minimum groundrule cell 34 is substantially smaller than the non-minimum groundrule cell 40 and replacement of the cell eliminates the whitespace 31.

The invention only replaces the non-critically timed minimum groundrule cells 34 with the non-minimum groundrule cells 40 if enough of the whitespace 31 is available to accommodate the non-minimum groundrule cells 40. The invention makes a determination of whether enough whitespace is based upon a comparison of the whitespace 31 to a library (70 in FIG. 6) of the non-minimum groundrule cells including cell size information. If the library indicates that the non-minimum groundrule cell 40 will fit in the whitespace 31, the cell is replaced. In addition, the library 70, may include many differently sized non-minimum groundrule cells 40 that would perform the same function each of the minimum groundrule cell 34 that is to be replaced. Thus, the invention chooses the largest non-minimum groundrule cell 40 that would fit in the whitespace 31 to fill as much as the whitespace 31 as possible.

Next, as shown in item 216, timing effects of the change are calculated. If the substitution of the minimum groundrule cell 34 with the non-minimum groundrule cell 40 violates timing (item 218), the minimum groundrule cell 34 is put back 220. Otherwise, the non-minimum groundrule cell 40 remains and processing proceeds to item 222, which repeats the process at item 210 for the remaining non-critically timed cells. Alternatively, if the cell library contains many alternative cell selections, the invention steps up and down to find the largest cell that will fit within the space and will also produce an acceptable timing result (e.g., work within the timing rules).

Timing paths within a circuit generally have an acceptable time limit (e.g., delay) within which signals are expected to pass through the path. Positive slack is the amount by which the acceptable time limit exceeds the actual delay seen. Some timing paths have a greater positive slack than other timing paths. The more positive slack a timing path has, the more additional delay it can accept without producing erroneous results. Therefore, when the invention determines whether the substitution of a non-minimum groundrule cell violates timing requirements, it also considers the amount of positive slack (additional delay) the timing path has before erroneous results are produced. Since the invention incrementally updates the positives slack at each cell substitution, a larger number of non-minimum groundrule cells can be substituted for the lower-yielding minimum groundrule cells.

The slack report is incrementally updated to reflect the timing change of the new cell and the process is continued for each non-timing critical cell identified. As is known in the art, power routing is finalized 224 and signals are routed 226. The chip is then verified 228.

Figure 4B:
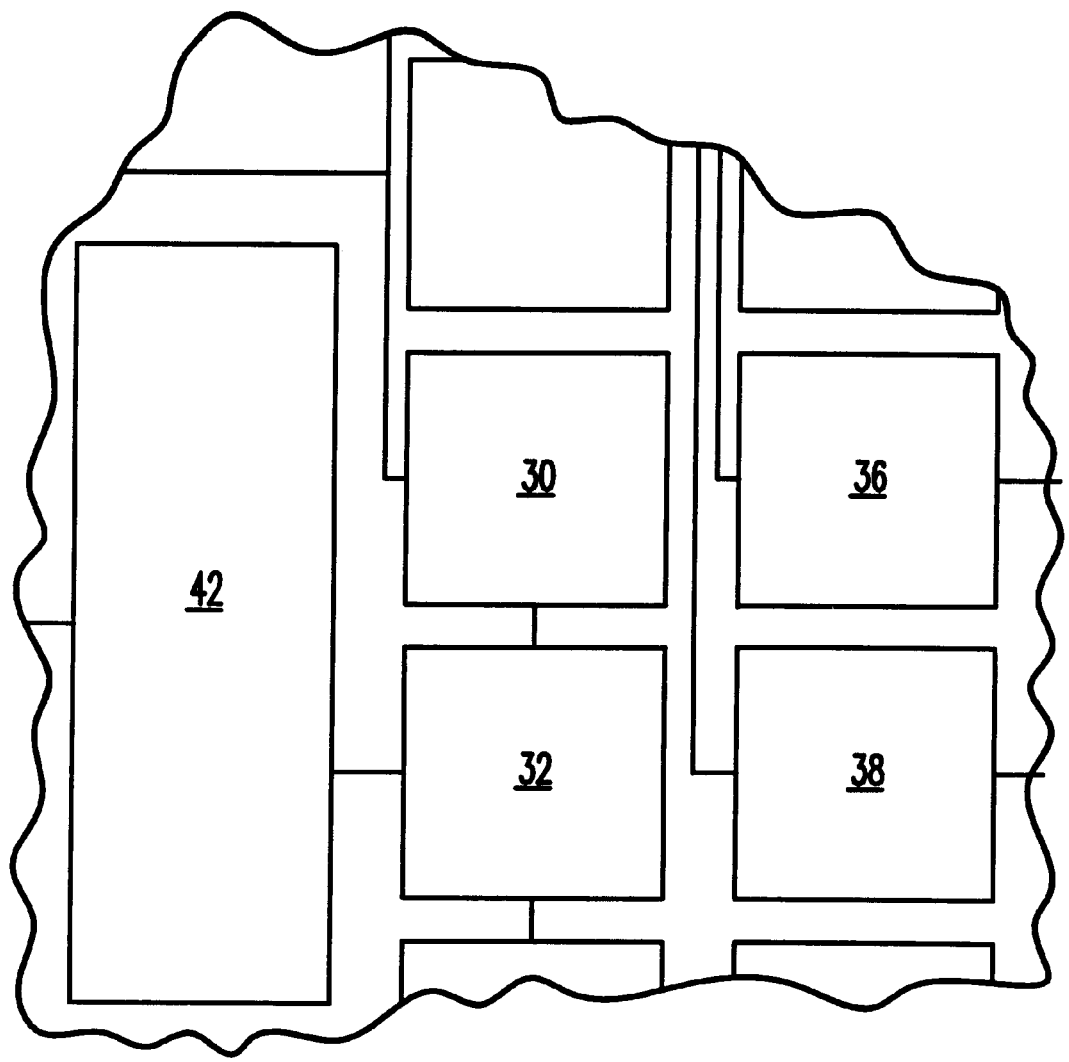
FIG. 4B is a schematic diagram of a portion of a chip design.

The invention described above increases chip yield by decreasing the number of lower-yielding cells (minimum groundrule cells) and increasing the number of higher-yielding cells (non-minimum groundrule cells). The process described above utilizes a measure of available whitespace to determine whether a substitution can be made for the non-critical cells. However, the invention is not limited to a whitespace calculation. To the contrary, the invention can perform a number of processes such as a minor rearrangement of cells to allow sufficient space for non-critical lower-yielding cells to be replaced with higher-yielding cells. For example, as shown in FIG. 4B, cells 30 and 32 are moved closer to cells 36 and 38 to combine whitespace 31 and additional whitespace above and below cells 30 and 32 (in FIG. 3) to allow a cell 42 that is even larger than cell 40 to replace cell 34.

While the overall methodology of the invention is described above, the invention can be embodied in any number of different types of systems and executed in any number of different ways, as would be known by one ordinarily skilled in the art. For example, as illustrated in FIG. 5, a typical hardware configuration of an information handling/computer system in accordance with the invention preferably has at least one processor or central processing unit (CPU) 500. For example, the central processing unit 500 could include various image/texture processing units, mapping units, weighting units, adders, subtractors, comparators, etc. Alternatively, as would be known by one ordinarily skilled in the art given this disclosure, multiple specialized CPU's (or other similar individual functional units) could perform the same processing, mapping, weighting, adding, subtracting, comparing, etc.

The CPU 500 is interconnected via a system bus 501 to a random access memory (RAM) 502, read-only memory (ROM) 503, input/output (I/O) adapter 504 (for connecting peripheral devices such as disk units 505 and tape drives 506 to the bus 501), communication adapter 507 (for connecting an information handling system to a data processing network) user interface adapter 508 (for connecting a peripherals 509, 510 such as a keyboard, mouse, microphone speaker and/or other user interface device to the bus 501), a printer 512, and display adapter 513 (for connecting the bus 501 to a display device 514). The invention could be implemented using the structure shown in FIG. 5 by including the inventive method within a computer program stored on the storage device 505. Such a computer program would act on information supplied through the interface units 509, 510 or through the network connection 507. The system would then automatically produce the final desired product on the display 514, through the printer 512 or back to the network 507.

A system embodiment of the invention is shown in FIG. 6. More specifically, FIG. 6 illustrates a timing path identifier 62 adapted to identify non-critically timed minimum groundrule cells located within the chip design 60. In addition, the invention includes a whitespace identifier 64 adapted to determine if whitespace exists around the non-critically timed minimum groundrule cells and a substitutor 66 adapted to replace the non-critically timed minimum groundrule cells that have the whitespace with non-minimum groundrule cells (if the substitution leaves the timing of the circuit unaltered). The timing of the circuit 60 is considered "unaltered" if the circuit has a similar timing performance with the non-critically timed minimum groundrule cells and the non-minimum groundrule cells.

The substitutor 66 includes a calculator 68 adapted to determine incremental timing effects caused by replacing each of the non-critically timed minimum groundrule cells with non-minimum groundrule cells. The substitutor 66 also incrementally returns selected ones of the non-critically timed minimum groundrule cells in place of the non-minimum groundrule cells in the chip design if the incremental timing effects indicate that the original substitution changes the circuit timing.

The substitutor 66 only replaces the non-critically timed minimum groundrule cells with the non-minimum groundrule cells if enough space is available to accommodate the non-minimum groundrule cells. The calculator 68 is able to determination whether enough whitespace is available based upon a comparison of the whitespace to the library 70 of the non-minimum groundrule cells containing cell size information.

The invention increases chip yield by decreasing the number of lower-yielding cells (e.g., minimum groundrule cells) and increasing the number of higher-yielding cells (e.g., non-minimum groundrule cells). However, the invention is not limited to only replacing minimum groundrule cells. Indeed, with the invention any sized cell can be replaced with a larger cell to achieve the benefits of the invention.

It would be obvious to those skilled in the art in light of this disclosure that the invention could be extended down the hierarchy of design to include block or macro level design, circuit design or even transistor level design. The invention provides the ability to automatically substitute non-critically designed cells for critically designed cells during the floorplan process (prior to routing) when extra whitespace exists, without impacting chip size or performance by using an incremental timing analysis approach.

While the invention has been described in terms of preferred embodiments, those skilled in the art will recognize that the invention can be practiced with modification within the spirit and scope of the appended claims.

What is claimed is:

1. A method of improving yield during physical chip design comprising:

identifying non-critically timed minimum groundrule cells located within said chip design;

determining if whitespace exists around said non-critically timed minimum groundrule cells; and replacing said non-critically timed minimum groundrule cells that have said whitespace with non-minimum groundrule cells if said replacing leaves a functionality of a circuit unaltered.

2. The method in claim 1, wherein said replacing includes calculating incremental timing effects caused by replacing each of said non-critically timed minimum groundrule cells with non-minimum groundrule cells; and incrementally returning selected ones of said non-critically timed minimum groundrule cells in place of said non-minimum groundrule cells in said chip design only if said incremental timing effects indicate that said replacing produces said circuit timing changes.

3. The method in claim 1, wherein said replacing only replaces said non-critically timed minimum groundrule cells with said non-minimum groundrule cells if enough space is available to accommodate said non-minimum groundrule cells, wherein a determination of whether enough whitespace is available is made based upon a comparison of said whitespace to a library of said non-minimum groundrule cells containing cell size information.

4. The method in claim 1, wherein a timing of said circuit is unaltered if said circuit has a similar timing performance with said non-critically timed minimum groundrule cells and said non-minimum groundrule cells.

5. The method in claim 1, wherein said non-critically timed minimum groundrule cells are physically smaller than said non-minimum groundrule cells.

6. The method in claim 1, wherein said non-critically timed minimum groundrule cells have a lower manufacturing yield than said non-minimum groundrule cells.

7. A method of improving yield during physical chip design comprising:

identifying non-critically timed first cells located within said chip design;

determining if space exists to substitute second cells for said non-critically timed first cells, wherein said second cells have a higher manufacturing yield than said first cells; and replacing said non-critically timed first cells that have sufficient space with second cells if said replacing leaves a functionality of a circuit unaltered.

8. The method in claim 7, wherein said replacing includes calculating incremental timing effects caused by replacing each of said non-critically timed first cells with said second cells; and incrementally returning selected ones of said non-critically timed first cells in place of said second cells in said chip design only if said incremental timing effects indicate that said replacing produces said circuit timing changes.

9. The method in claim 7, wherein said replacing only replaces said non-critically timed first cells with said second cells if enough of said space is available to accommodate said second cells, wherein a determination of whether enough space is available is made based upon a comparison of said space to a library of said second cells.

10. The method in claim 7, wherein said timing of said circuit is unaltered if said circuit has a similar timing performance with said non-critically timed first cells and said second cells.

11. The method in claim 7, wherein said non-critically timed first cells are physically smaller than said second cells.

12. A system of improving yield during physical chip design comprising:

a timing path identifier adapted to identify non-critically timed minimum groundrule cells located within said chip design;

a whitespace identifier adapted to determine if whitespace exists around said non-critically timed minimum groundrule cells; and a substitutor adapted to replace said non-critically timed minimum groundrule cells that have said whitespace with non-minimum groundrule cells if said replacing leaves a functionality of a circuit unaltered.

13. The system in claim 12, wherein said substitutor includes a calculator adapted to determine incremental timing effects caused by replacing each of said non-critically timed minimum groundrule cells with non-minimum groundrule cells; and said substitutor being further adapted to incrementally return selected ones of said non-critically timed minimum groundrule cells in place of said non-minimum groundrule cells in said chip design only if said incremental timing effects indicate that replacing of said non-critically timed minimum groundrule cells with non-minimum groundrule cells produces a circuit timing changes.

14. The system in claim 12, wherein said substitutor only replaces said non-critically timed minimum groundrule cells with said non-minimum groundrule cells if enough space is available to accommodate said non-minimum groundrule cells, said system further comprising a calculator adapted to determination whether enough whitespace is available based upon a comparison of said whitespace to a library of said non-minimum groundrule cells containing cell size information.

15. The system in claim 12, wherein said timing of said circuit is unaltered if said circuit has a similar timing performance with said non-critically timed minimum groundrule cells and said non-minimum groundrule cells.

16. The system in claim 12, wherein said non-critically timed minimum groundrule cells are physically smaller than said non-minimum groundrule cells.

17. The system in claim 12, wherein said non-critically timed minimum groundrule cells have a lower manufacturing yield than said non-minimum groundrule cells.

18. A program storage device readable by machine tangibly embodying a program of instructions executable by said machine for performing a method of improving yield during physical chip design, said method comprising:

identifying non-critically timed minimum groundrule cells located within said chip design;

determining if whitespace exists around said non-critically timed minimum groundrule cells; and replacing said non-critically timed minimum groundrule cells that have said whitespace with non-minimum groundrule cells if said replacing leaves a functionality of a circuit unaltered.

19. The program storage device in claim 18, wherein said replacing includes calculating incremental timing effects caused by replacing each of said non-critically timed minimum groundrule cells with non-minimum groundrule cells; and incrementally returning selected ones of said non-critically timed minimum groundrule cells in place of said non-minimum groundrule cells in said chip design only if said incremental timing effects indicate that said replacing produces said circuit timing changes.

20. The program storage device in claim 18, wherein said replacing only replaces said non-critically timed minimum groundrule cells with said non-minimum groundrule cells if enough space is available to accommodate said non-minimum groundrule cells, wherein a determination of whether enough whitespace is available is made based upon a comparison of said whitespace to a library of said non-minimum groundrule cells containing cell size information.

21. The program storage device in claim 18, wherein a timing of said circuit is unaltered if said circuit has a similar timing performance with said non-critically timed minimum groundrule cells and said non-minimum groundrule cells.

22. The program storage device in claim 18, wherein said non-critically timed minimum groundrule cells are physically smaller than said non-minimum groundrule cells.

23. The program storage device in claim 18, wherein said non-critically timed minimum groundrule cells have a lower manufacturing yield than said non-minimum groundrule cells.

24. A system for improving yield during physical chip design comprising:

means for identifying non-critically timed minimum groundrule cells located within said chip design;

means for determining if whitespace exists around said non-critically timed minimum groundrule cells; and means for replacing said non-critically timed minimum groundrule cells that have said whitespace with non-minimum groundrule cells if said replacing leaves a functionality of a circuit unaltered.

* * * * *